United States Patent
Gardner et al.

(10) Patent No.: US 6,306,763 B1
(45) Date of Patent: *Oct. 23, 2001

(54) ENHANCED SALICIDATION TECHNIQUE

(75) Inventors: Mark I. Gardner, Cedar Creek; H. Jim Fulford, Jr., Austin, both of TX (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/896,397

(22) Filed: Jul. 18, 1997

(51) Int. Cl.$^7$ ............................................. H01L 21/44
(52) U.S. Cl. ................. 438/659; 438/482; 438/527
(58) Field of Search ......................... 437/40, 41, 44, 437/46, 27, 200, 35; 438/532, 303, 592, 302, 659, 482, 527; 257/345, 66, 646; 156/613; 29/576, 528

(56) References Cited

U.S. PATENT DOCUMENTS

| | | | |
|---|---|---|---|
| 4,343,082 | * 8/1982 | Lepselter et al. | 29/576 |
| 4,554,045 | * 11/1985 | Bean et al. | 156/613 |
| 4,683,645 | * 8/1987 | Naguib et al. | 437/41 |
| 4,737,474 | * 4/1988 | Price et al. | 437/200 |
| 4,889,819 | * 12/1989 | Davari et al. | 437/27 |
| 4,897,368 | * 1/1990 | Kobushi et al. | 437/200 |
| 5,086,017 | * 2/1992 | Lu | 437/200 |
| 5,130,266 | * 7/1992 | Huang et al. | 437/44 |
| 5,187,122 | * 2/1993 | Bonis | 437/200 |
| 5,427,964 | * 6/1995 | Kaneshiro et al. | 437/41 |
| 5,428,244 | * 6/1995 | Segawa et al. | 257/646 |

(List continued on next page.)

OTHER PUBLICATIONS

R.F. Bunshah, "Handbook of Deposition Technologies for Films and Coatings", 2nd ed., 1994, Noyes Publication, NJ, USA.*
S.M. Sze, "Physics of Semiconductor Devices", John Wiley & Sons 1981, Taipei, Taiwan, 2nd edition, 1983.*
*Physics of Semiconductor Devices*, Second Edition, S.M. Sze, Bell Laboratories, Inc., John Wiley & Sons, 1981, pp. 431–486.

Primary Examiner—Olik Chaudhuri
Assistant Examiner—Ginette Peralta
(74) Attorney, Agent, or Firm—Kevin L. Daffer; Conley, Rose & Tayon P.C.

(57) ABSTRACT

A semiconductor fabrication process in which enhanced salicidation and reliability is achieved by implanting a silicon bearing species and a nitrogen bearing species into the source/drain regions and polysilicon regions of an integrated circuit transistor prior to the silicide formation sequence. A gate dielectric is formed on an upper surface of a semiconductor substrate. The substrate includes an active region that is laterally disposed between a pair of isolation structures. The active region includes a channel region that is laterally disposed between a pair of source/drain regions. A conductive gate structure is formed on the upper surface of the semiconductor substrate aligned over the channel region A silicon bearing species is then implanted or otherwise introduced into the conductive gate structure and into the source/drain regions to form amorphous silicon rich regions proximal to respective upper surfaces of the source/drain regions and the conductive gate structure. A nitrogen bearing species is then implanted into the conductive gate source/drain regions and a source/drain impurity distribution is introduced into the source/drain regions. A self aligned silicide process, in which a refractory metal is deposited upon the substrate upper surface and heated to a reaction temperature to form a silicide compound over exposed silicon regions of the substrate, preferably follows the formation of the source/drain regions

22 Claims, 2 Drawing Sheets

U.S. PATENT DOCUMENTS

| | | | |
|---|---|---|---|
| 5,441,906 | * | 8/1995 | Burger ................................. 437/41 |
| 5,460,986 | * | 10/1995 | Tam et al. ........................... 437/40 |
| 5,478,763 | * | 12/1995 | Hong .................................. 437/35 |
| 5,530,265 | * | 6/1996 | Takemura ........................... 257/66 |
| 5,545,574 | * | 8/1996 | Chen et al. ......................... 437/40 |
| 5,554,871 | * | 9/1996 | Yamashita et al. ............... 257/336 |
| 5,557,129 | * | 9/1996 | Oda et al. .......................... 257/345 |
| 5,565,383 | * | 10/1996 | Sakai ................................. 437/200 |
| 5,605,848 | * | 2/1997 | Ngaoaram .......................... 437/24 |
| 5,654,210 | * | 8/1997 | Aronowitz et al. ............... 438/526 |
| 5,665,646 | * | 9/1997 | Kitano ............................... 438/592 |
| 5,739,064 | * | 4/1998 | Hu et al. ........................... 438/528 |
| 5,759,899 | * | 6/1998 | Saito ................................. 438/303 |
| 5,773,347 | * | 6/1998 | Kimura et al. .................... 438/302 |
| 5,915,196 | * | 6/1999 | Mineji ............................... 438/526 |

* cited by examiner

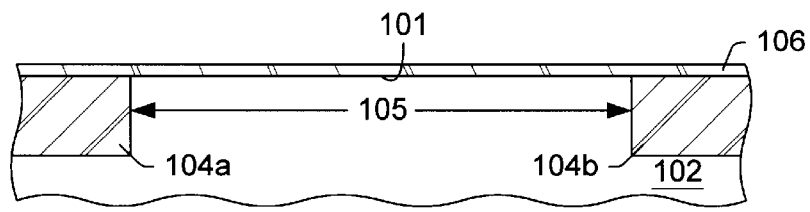
FIG. 1
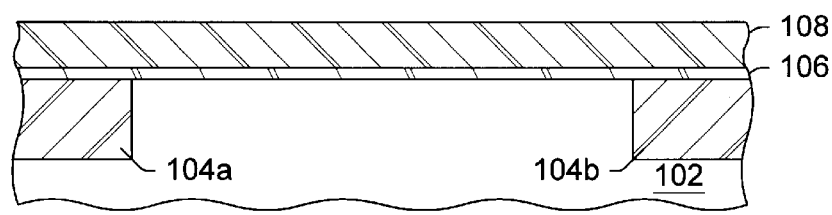
FIG. 2
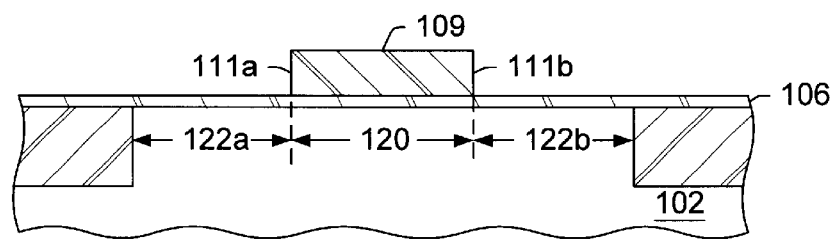
FIG. 3
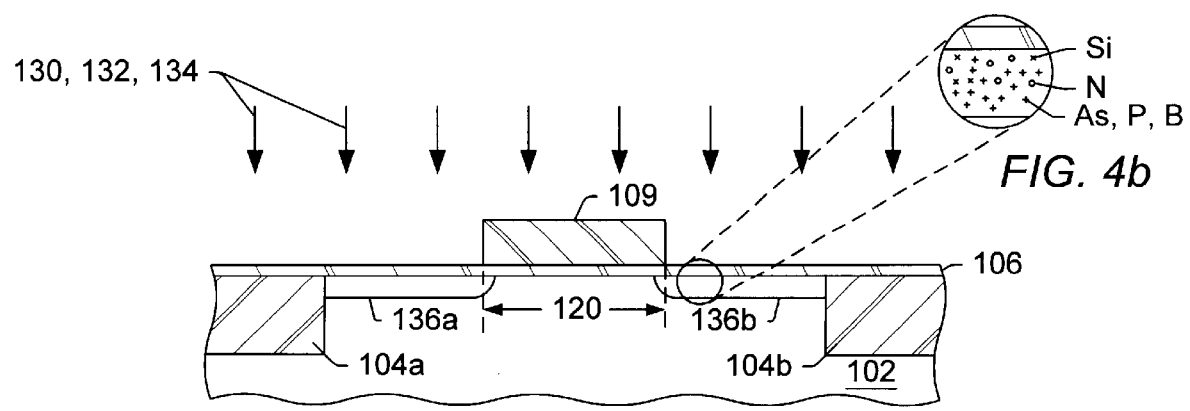
FIG. 4a
FIG. 4b

ENHANCED SALICIDATION TECHNIQUE

BACKGROUND OF THE INVENTION

1. Field of the Invention

The present invention relates to the field of semiconductor processing and more particularly to a process for improving a salicide process while simultaneously improving the reliability of the integrated circuit.

2. Description of the Relevant Art

MOS transistors may be broadly characterized as either short channel or long channel devices. In an ideal long channel device, the sub-threshold current is independent of the drain voltage, the threshold voltage is independent of the channel length and the transistor biasing, and the drain current in the saturation region is independent of the drain voltage. It will be appreciated that these characteristics of long channel devices are desirable from a manufacturing and circuit design perspective because of their tendency to minimize subthreshold currents and threshold voltage variation among transistors of varying dimensions. In contrast, short channel devices are characterized by a subthreshold current that varies with drain voltage, a threshold voltage that varies with channel length and biasing conditions, and a failure of current saturation in the saturation region. The minimum channel length which can be expected to result in long channel subthreshold behavior for a given set of process parameters varies with the junction depth $x_j$ as indicated by the equation:

$$L_{min} = \gamma' x_j^{1/3} \qquad \text{Eq. 1}$$

where $\gamma' = 0.4[t_{ox}(W_s + W_d)^2]^{1/3}$ and $t_{ox}$ is the thickness of the gate dielectric and $W_s$ and $W_d$ are the depletion layer widths around the source and drain respectively. See, e.g., S. M. Sze., *Physics of Semiconductor Devices* pp. 431–86 (John Wiley and Sons, 1981). As indicated by Equation 1, the minimum channel length for long channel operation varies with the cube root of the junction depth (other parameters being equal). As the channel length of MOS transistors has been reduced through advancements in photolithography and other semiconductor processing techniques, the significance of the subthreshold characteristics and the efforts to minimize subthreshold effects have been correspondingly increased. Unfortunately, the conventional methods of forming source/drain regions have proven frustrating for process designers attempting to minimize short channel effects. Typically, source/drain regions are fabricated by an ion implantation technique in which energetic ions of appropriate impurities, or boron are implanted into a single crystal silicon substrate. Even when used in conjunction with a dielectric layer formed on the surface prior to the implantation, the ion implantation process typically results in a junction depth $x_j$ that places a lower limit on the minimum channel device that can be fabricated with long channel characteristics. In addition, processing subsequent to the ion implantation process typically redistributes the ion implantation distributions such that the as implanted junction depth is less than the junction depth that exists at the completion of the fabrication process. Accordingly, efforts to minimize short channel effects in MOS transistors in the submicron range have been greatly constrained by the minimum junction depth $x_j$ typically available with the standard MOS transistor formation process.

In addition to minimizing junction depth, decreasing the resistivity of structures that contact the silicon source/drain regions and the polysilicon gate conductor also increases in significance as the features of integrated circuits continue to shrink. Highly resistive contact structures result in increased capacitive coupling and decreased device performance by increasing the RC time constant of the associated interconnect structure.

The RC time constant of an interconnect structure is expressed in the following form:

$$RC = R_s L^2 \epsilon_{ox} / X_{ox} \qquad \text{(Eq. 2)}$$

where $R_s$ is the interconnect's sheet resistance, L is the length of the interconnect, $X_{ox}$ is the dielectric thickness underlying the interconnect, and $\epsilon_{ox}$ is the permittivity of the underlying dielectric, such as silicon dioxide. In order to fabricate dense, high speed MOS devices, Equation 2 illustrates the benefits of minimizing the resistivity $R_s$ as much as possible and this includes minimizing the contact resistance.

One way in which to reduce the resistivity of contacts to the gate conductor is to substitute aluminum for polysilicon because the resistivity of aluminum is considerably lower than that of polysilicon. Unfortunately, the relatively low melting point of aluminum makes the use of aluminum as a gate/interconnect an impossibility if subsequent processing steps involve temperature cycles greater than approximately 500° C. (In addition, using aluminum for the transistor gate does nothing to decrease the resistance of contacts to the source/drain regions.) Aluminum is, therefore, typically used only at the latter stages of integrated circuit fabrication (i.e., after the high temperature cycles such as impurity drive-in and anneal) are completed.

To address the contact resistance problems noted above, silicide structures have been employed. A silicide is a refractory metal-silicon composite typically formed at the upper surface of the silicon structure. Silicides are commonly formed by depositing a refractory metal across the silicon upper surface (for purposes of this application, a refractory metal is a metal having a melting point in excess of approximately 1400° C.). The silicon/metal interface is then heated to react the silicon with the overlying metal to form the silicide. Any unreacted metal portion is then typically removed leaving only the silicide at the upper surface of the silicon. The silicide structure beneficially reduces the resistivity of subsequently formed contacts.

In many conventional processes that employ silicides, however, achieving a uniform resistivity for silicides formed over polysilicon interconnects of varying geometries is difficult. It is theorized that regions of high resistivity polysilicon, in which mobile carriers become easily trapped, exist in the vicinity of the grain boundaries characteristic of polysilicon films. It is further theorized that, as these regions become comparable in size to the overall width of the polysilicon interconnect, insufficient quantities of silicon are available to form high quality silicides. Accordingly, the formation rate and quality of silicides formed on the upper surface of narrow polysilicon interconnects may drop below the formation rate and quality of silicides formed on wider polysilicon structures. Geometry dependent silicide resistivity is undesirable because semiconductor devices and processes are almost universally designed and simulated under the assumption that silicide resistivity, as with most other parameters, will not exhibit a geometric dependence. Accordingly, it is highly desirable to implement a fabrication process that minimizes geometric variations in silicide resistivity.

The most popular refractory metals for use in semiconductor processing include the Group VIII metals or titanium (Ti). The Group VIII metals include cobalt (Co), platinum (Pt), palladium (Pd), and nickel (Ni). The Group VIII metals typically react with underlying silicon at relatively low temperatures, e.g., at 600° C. or less. The Group VIII metals exhibit fairly low resistivity; however, they cannot reduce substantially thick native oxides formed on the silicon-based surface. More specifically, Group VIII metal atoms and silicon atoms cannot interdiffuse across a native oxide having a thickness exceeding, for example, 50 angstroms. Resulting from the shortcomings of Group VIII metals, titanium has been used for its ability to reduce native oxide layers exceeding 50 angstroms. Titanium is the only known refractory metal that can reliably form silicide on both polysilicon and silicon surfaces having naturally occurring native oxides.

The benefits of titanium readily diffusing into underlying silicon is also a detriment, to some extent. Elaborate procedures have been established to prevent excessive interdiffusion not only in the underlying silicon surface, but also into adjacent oxide surfaces. Even though titanium diffusion is carefully controlled using, for example, a two-step anneal sequence, the affinity of titanium and silicon interdiffusion is so extensive that in some instances titanium can "spike" through relatively shallow junctions. It would therefore be desirable to implement a silicide process that addresses the problems of junction spiking without adding elaborate procedures or extensive costs to the manufacturing process.

SUMMARY OF THE INVENTION

The problems identified above are in large part addressed by a semiconductor fabrication process in which enhanced salicidation is achieved by implanting a silicon bearing species into the source/drain regions of the integrated circuit transistor and incorporating nitrogen into the gate structure of the transistor to provide a barrier that minimizes the transistor's susceptibility to mobile ions such as boron while simultaneously minimizing the occurrence of junction spiking during the silicide formation sequence. By improving the transistor's resistance to the penetration of mobile impurities and by super saturating the transistor's terminals with silicon, the present invention provides a transistor with improved salicidation properties and minimizes the transistor's susceptibility to threshold voltage shifting and other undesired effects due to mobile contaminants.

Broadly speaking, the invention contemplates a semiconductor fabrication process in which a gate dielectric is formed on an upper surface of a semiconductor substrate. The substrate includes an active region that is laterally disposed between a pair of isolation structures. The active region includes a channel region that is laterally disposed between a pair of source/drain regions. After the formation of the gate dielectric, a conductive gate structure is formed on the upper surface of the semiconductor substrate. The conductive gate is aligned over the channel region of the substrate. A silicon bearing species is then implanted or otherwise introduced into the conductive gate structure and into the source/drain regions to form amorphous silicon rich regions. The silicon rich regions of the gate structure and the source/drain regions are proximal to respective upper surfaces of the source/drain regions and the conductive gate structure. The silicon rich regions include a silicon impurity concentration greater than the intrinsic atomic concentration of a single crystal silicon substrate (i.e., approximately $5 \times 10^{22}$ atoms/cm$^3$ at 300° K). A nitrogen bearing species is then implanted into the conductive gate and a source/drain impurity distribution is introduced into the source/drain regions.

Preferably, the semiconductor substrate is a single crystal silicon wafer in which a p-type epitaxial layer having a sheet resistivity preferably in the range of approximately 10–15Ω-cm is formed over a p+ silicon bulk. The formation of the gate dielectric is preferably accomplished by thermally oxidizing an upper surface of the semiconductor substrate at a temperature in the range of approximately 500–900° C. The formation of the conductive gate structure is accomplished in a presently preferred embodiment by depositing polysilicon on an upper surface of the gate dielectric. The preferred polysilicon deposition process includes thermally decomposing silane in a chemical vapor deposition reactor chamber maintained at a temperature in the range of approximately 580–650°. A photoresist film is then deposited on the polysilicon and photolithographically patterned to produce a patterned photoresist film that includes a photoresist structure that is aligned over the channel region of the semiconductor substrate. A plasma etch is then performed to remove exposed portions of the polysilicon film. In the preferred embodiment, the silicon implant is accomplished using an implant dose in the range of approximately $10^{14}$ to $10^{16}$ atoms/cm$^2$. A preferred implant energy for the silicon implant is in the range of approximately 10–15 keV. A preferable implant dose for implanting nitrogen is in the range of approximately $10^{14}$–$10^{16}$ atoms/cm$^2$. The nitrogen may be introduced in the semiconductor substrate using an implant species such as $N_2O$, NO, N, and $N_2$. The nitrogen implanted is preferably accomplished using an implant energy in the range of approximately 10 to 50 keV.

The introduction of the source/drain impurity distribution in one embodiment includes implanting a lightly doped impurity distribution into the semiconductor substrate using the conductive gate structure as an implant mask so that the lightly doped impurity distribution is aligned with the sidewalls of the conductive gate structure. Spacer structures are then formed on the sidewalls to mask portions of the source/drain regions that are proximal to the channel region. A heavily doped impurity distribution is then implanted into the semiconductor substrate. The presence of the conductive gate structure and the spacer structures during the implanting of the heavily doped impurity distribution ensures that the boundaries of the heavily doped impurity distribution within the semiconductor substrate are laterally displaced from respective boundaries of the channel region. A preferable implant dose for the lightly doped impurity distribution is less than approximately $2 \times 10^{15}$ using an implant energy in the range of approximately 10–50 keV. A preferable dose for the heavily doped impurity distribution implant is greater than approximately $2 \times 10^{15}$ atoms/cm$^2$ using an implant energy in the range of approximately 20–100 keV. The spacer structures are typically formed by depositing a conformal dielectric layer on a topography defined by the semiconductor substrate and the conductive gate structure of the dielectric layer above planar regions of the topography. These planar regions are defined as regions substantially parallel with the upper surface of the semiconductor substrate. The deposition of the conformal dielectric layer is suitably accomplished by decomposing TEOS in a chemical vapor deposition reactor chamber maintained at a temperature in the range of approximately 650–750° C. at a pressure of less than approximately 2 torr. In one embodiment, the present invention further includes removing the dielectric layer from portions of the semiconductor substrate upper surface disposed above the source/drain regions and depositing a siliciding metal on a topography comprising the semiconductor substrate, the conductive gate structure and the spacer structures. The semiconductor substrate is then heated to react the metal with the source/drain regions and the conductive gate structure to form silicide regions within the source/drain region and within the conductive gate structure. The sheet resistivity of the silicide thereby formed is less than the corresponding sheet resistance of the non-silicided source/drain regions or non-silicided conductive gate structure.

The present invention further contemplates an integrated circuit transistor. The transistor includes a semiconductor substrate which has an active region laterally disposed between a pair of isolation structures. The active region includes a channel region laterally disposed between a pair of source/drain regions. The transistor includes a gate dielectric formed on an upper surface of the semiconductor substrate aligned over the channel region of the substrate. A conductive gate structure resides on an upper surface of the gate dielectric. The conductive gate structure includes sidewalls on which a pair of spacer structures are formed. The spacer structures mask peripheral portions of the source/drain regions proximal to the channel region of the semiconductor substrate. The transistor further includes a pair of source/drain impurity distributions within the pair of source/drain regions. The impurity distributions include an impurity concentration of boron, arsenic or phosphorous in excess of approximately $10^{19}$ atoms/cm$^3$. The transistor further includes silicide structures located on upper regions of the pair of source/drain regions and on an upper surface of the conductive gate structure. A silicon rich region exists below the silicide structure within the source/drain regions. The silicon rich region includes a silicon impurity distribution of greater than approximately $5\times10^{22}$ atoms/cm$^3$ such that the silicon rich region is said to be super saturated with silicon. The conductive gate structure and the source/drain structures further include a nitrogen impurity distribution. The nitrogen impurity distribution within the conductive gate structure substantially inhibits the migration or penetration of mobile impurities within the conductive gate structure from traveling into and through the channel region of the semiconductor substrate.

In the preferred embodiment, the semiconductor substrate comprises single crystal silicon. The conductive gate structure includes polysilicon, while the silicide material is preferably comprised of titanium silicide (TiSi). In the preferred embodiment, the pair of source/drain regions each include a lightly doped impurity distribution laterally disposed on either side of the channel region of the semiconductor substrate and a heavily doped impurity distribution. The heavily doped impurity distribution boundaries are laterally displaced from the channel region by a displacement approximately equal to a width or lateral dimension of the spacer structures.

BRIEF DESCRIPTION OF THE DRAWINGS

Other objects and advantages of the invention will become apparent upon reading the following detailed description and upon reference to the accompanying drawings in which:

FIG. 1 is a partial cross-sectional view of a semiconductor substrate including an active region laterally displaced between a pair of isolation regions and further including a gate dielectric layer formed on an upper surface of the semiconductor substrate;

FIG. 2 is a processing step subsequent to FIG. 1 in which a conductive gate layer is deposited on the gate dielectric layer;

FIG. 3 is a processing step subsequent to FIG. 2 in which the conductive gate layer has been patterned to form a patterned gate structure;

FIGS. 4a and 4b are a processing step subsequent to FIG. 3 in which one or more ion implantation steps is performed to introduced impurities into the semiconductor substrate using the conductive gate structure as an implant mask;

Figure 5:
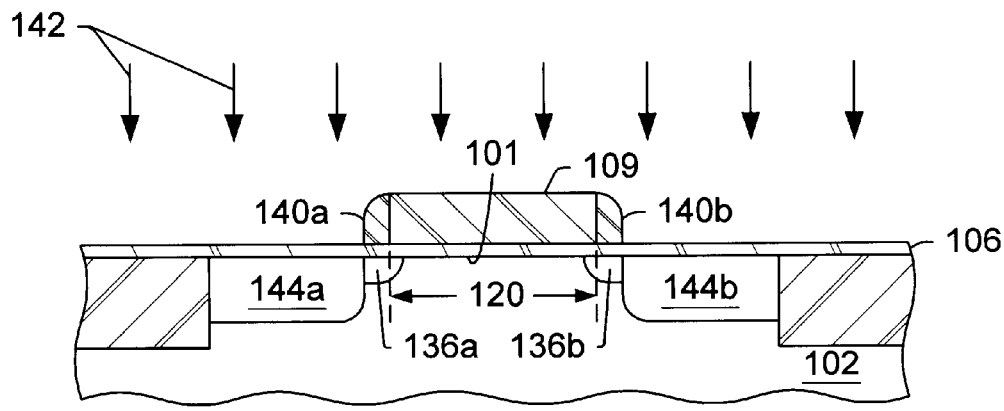
FIG. 5 is a processing step subsequent to FIGS. 4a and 4b in which spacer structures have been formed on the conductive gate sidewalls and an additional implant performed to introduce a heavily doped source/drain impurity distribution into the semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIG. 1 shows a semiconductor substrate 102 and a gate dielectric layer 108 formed on upper surface 101 of semiconductor substrate 102. Semiconductor substrate 102 preferably comprises a single crystal silicon wafer such as are well known in the field of semiconductor processing. In one embodiment useful in the fabrication of CMOS integrated circuits, semiconductor substrate 102 includes a p+ silicon bulk (not shown in the drawing) upon which a p-type epitaxial layer has been formed. A preferred resistivity of the p-type epitaxial layer is in the range of approximately 10–15 Ω-cm. Isolation structures 104a and 104b as shown in FIG. 1 comprise shallow trench isolation structures. A typical shallow trench isolation structure is formed by etching an isolation trench into the semiconductor substrate and thereafter filling the trench with a dielectric such as CVD oxide. After the trench has been filled with an appropriate dielectric, the planarization process is typically performed to produce a substantially planar upper surface upon which the gate dielectric may be grown. It will be appreciated to those skilled in the art of semiconductor processing that alternative isolation structures such as a conventional LOCOS isolation structure may be substituted for the shallow trench isolation structure of FIG. 1. Gate dielectric layer 106, in a presently preferred embodiment, comprises a thermally formed silicon-oxide film. Gate dielectric 106 is preferably fabricated by immersing semiconductor substrate 102 into an oxidation chamber which includes an oxygen bearing ambient maintained at a temperature in the range of approximately 500–900° C. In a presently preferred embodiment, a thickness of gate dielectric 108 over active region 105 of semiconductor substrate 102 is in the range of approximately 15–100 angstroms.

Turning now to FIG. 2, a conductive gate layer 108 is formed upon an upper surface of gate dielectric layer 106. In a presently preferred embodiment, conductive gate layer 108 comprises heavily doped polysilicon. In a preferred process for forming gate dielectric layer 106, silane is thermally decomposed in a chemical deposition reactor chamber maintained at a temperature in the range of approximately 580–650° C. To obtain a suitable resistivity of the polysilicon layer, an impurity such as phosphorous, boron, or arsenic is typically introduced conductive layer 108 either in situ (i.e., during the deposition of the film) or subsequent to the deposition with the use of an ion implantation process. For purposes of this disclosure, a heavily doped polysilicon refers to a polysilicon having a sheet resistivity less than approximately 500 Ω/square. In an alternative embodiment useful in fabrication processes in which it is possible to maintain a maximum temperature of less than approximately 500° C. subsequent to the deposition of conductive gate layer 108, conductive gate layer 108 may be comprised of a metal such as aluminum, copper, tungsten or an appropriate alloy thereof.

Turning now to FIG. 3, conductive gate structure 109 is fabricated from conductive gate layer 108. Conductive gate structure 109 includes a pair of sidewalls 111a and 111b that are laterally aligned over boundary regions of a channel region 120 of semiconductor substrate 102. Channel region 120 is laterally disposed between a pair of source/drain regions 122a and 122b. Thus, it will be appreciated that conductive gate structure 109 is aligned over channel region 120 of semiconductor substrate 102. A suitable process for forming conductive gate structure 109 from conductive gate layer 108 includes a conventional photolithography process in which a photoresist film is deposited over the conductive gate layer 108. The photoresist film is then photolithographically patterned to produce a patterned photoresist film which includes a photoresist structure aligned over the channel region 120 of semiconductor substrate 102. The exposed portions of conductive gate layer 108 are then removed with a conventional plasma etch process which is well known in the field of semiconductor processing. The pattern photoresist film is then removed from the semiconductor substrate with a photoresist strip process.

Turning now to FIG. 4, one or more impurity distributions are introduced to semiconductor substrate 102 through the use of ion implantation processes represented in FIG. 4 by reference numerals 130, 132, and 134. In one embodiment, ion implantation 130 introduces a silicon bearing impurity distribution into conductive gate structure 109 and into upper portions of the pair of source/drain regions 122a and 122b. The introduction of a silicon impurity distribution into a silicon substrate is desirable for facilitating a subsequent salicidation process and for amorphizing the silicon substrate to facilitate shallow junction formation by minimizing channeling effects during a subsequent source/drain implant. It will be appreciated to those skilled in the art that implanting silicon into a crystalline substrate generates a localized amorphous region of the upper surface of the substrate. By implanting silicon into a silicon substrate, the present invention creates a super saturated amorphous silicon region in which the silicon atomic concentration exceeds approximately $5 \times 10^{22}$ atoms/cm$^3$. The super saturated silicon region reacts with an appropriate metal such as titanium during a subsequent silicide formation process. Silicides, as are well known in the field of semiconductor processing, beneficially reduce the contact resistance between an underlying silicon layer and a subsequently fabricated interconnect structure. The presence of the amorphous super saturated silicon is depicted in FIG. 4b, which shows an exploded view of a localized region within an upper region of semiconductor substrate 102.

In addition to the implanted silicon, the present invention contemplates an implantation process for introducing a nitrogen bearing species into the conductive gate structure 109. The introduction of a nitrogen bearing species into a conductive gate of a semiconductor transistor beneficially provides a barrier to migrating impurities. In particular, it is known that certain impurities such as boron are highly mobile within silicon. Such mobile impurities may migrate through the relatively thin gate dielectric 106 and distribute themselves within channel region 120 of semiconductor substrate 102. The presence of certain impurities including boron within the channel region of an integrated circuit transistor will undesirably alter the threshold voltage of the transistor. Incorporating a nitrogen bearing species into conductive gate structure 109, therefore, improves the long term reliability of the integrated circuit by preventing a long term threshold voltage variation. In one embodiment, the introduction of the nitrogen bearing species into conductive gate structure 109 is accomplished after the patterning of conductive gate layer 108 such that the implant process used to introduce the nitrogen into conductive gate structure simultaneously introduces a nitrogen bearing species into the pair of source/drain regions 122a and 122b of semiconductor substrate 102. In this embodiment, it is contemplated that the presence of a nitrogen bearing species within the upper regions of a semiconductor substrate may prevent significant migration of local impurities within the source/drain regions thereby further facilitating the fabrication of shallow junctions (junctions which have a junction depth of less than approximately 2000 angstroms. In addition, it is believed that the incorporation of nitrogen into the polysilicon of conductive gate structure 109 and into the source/drain regions 122a and 122b will retard the interdiffusion of a subsequently deposited refractory metal (such as titanium) through the silicon thereby further facilitating shallow junction formation by minimizing junction spiking. Preferably, the introduction of a nitrogen bearing species into conductive gate structure 109, which is represented in FIG. 4a by reference numeral 132, is accomplished by using an implant species selected from the group of $N_2O$, $NO$, $N_2$, or other appropriate nitrogen species. The nitrogen species implant dose is, in a presently preferred embodiment, in the range of approximately $10^{14}$ to $10^{16}$ atoms/cm$^2$. A suitable implant energy for the nitrogen implant 132 is preferably in the range of approximately 10–50 keV. The presence of the nitrogen bearing species within an upper region of semiconductor substrate 102 is depicted in FIG. 4b in which the small circular elements identifying nitrogen bearing atoms.

In the embodiment of the present invention represented in FIGS. 4a and 5, it will be recognized to those skilled in the art of semiconductor processing that a lightly doped drain transistor is contemplated. Accordingly, FIG. 4a depicts a potential third implant represented in FIG. 4a as reference numeral 134 designed to introduce an impurity distribution into the source/drain regions 122a and 122b of semiconductor substrate 102. In a presently preferred embodiment, the introduction of a source/drain impurity distribution into the source drain regions 122a and 122b of semiconductor substrate 102 is accomplished by implanting a lightly doped impurity distribution, represented in FIG. 4a by reference numeral 136a and 136b, into semiconductor substrate 102. The presence of conductive gate structure 109 during lightly doped implant 134 serves to align lightly doped impurity distributions 136a and 136b with respective sidewalls 111 of conductive gate structure 109. In this manner, it will be appreciated that lightly doped impurity distributions 136a and 136b extend laterally to positions approximately coincident with respective boundaries of channel region 120. Suitable implant species used to accomplish the formation of lightly doped impurity distributions 136a and 136b include boron, arsenic, or phosphorous. In a presently preferred embodiment, the implant dose of implant 134 is less than approximately $2\times10^{15}$ atoms/cm$^2$. A suitable implant energy which may be used to achieve relatively shallow source/drain impurity distributions 136a and 136b in the range of approximately 10–50 keV. The presence of the appropriate impurity distribution introduced by implant 134 is shown in FIG. 4b by the presence of the "+" symbols. Lightly doped impurity distributions such as impurity distributions 136a and 136b beneficially facilitate the reduction of the maximum electric field that occurs during device operation proximate to channel region 120. The reduction of the maximum electric field is desirable to minimize the rate at which "hot" electrons are injected through gate dielectric 106 into conductive gate structure 109. Left unabated, hot electron effects can reduce the reliability of gate dielectric 106 and can alter the threshold voltage of the subsequently formed transistor.

Turning now to FIG. 5, a pair of spacer structures 140a and 140b have been fabricated on respective sidewalls 111a and 111b of conductive gate structure 109. Spacer structures such as spacer structures 140a and 140b facilitate the formation of a graded junction contemplated by the lightly doped drain process. More specifically, the presence of spacer structures 140a and 140b (as well as the presence of conductive gate structure 109) results in a lateral displacement of the resulting impurity distribution away from the boundaries of channel region 120 within semiconductor substrate 102. This lateral displacement of the second source/drain impurity distribution 144a and 144b is a desirable method for achieving the reduction in electric field within channel region 120. Heavily doped impurity distributions 144a and 144b are ideally introduced into semiconductor substrate 102 with the use of an implantation process represented in FIG. 5 by reference numeral 142. In a presently preferred embodiment, implant 142 is accomplished using an implant species of boron, phosphorous or arsenic with an implant dose greater than approximately $2\times10^{15}$ atoms/cm$^2$ and a suitable implant energy is in the range of approximately 20 to 100 keV. The formation of spacer structures 140a and 140b is accomplished in a presently preferred embodiment by depositing a conformal dielectric layer on a topography 141 defined by upper surfaces of semiconductor substrate 102 and conductive gate structure 109. The deposition of the conformal dielectric layer is preferably accomplished by decomposing TEOS in a chemical vapor deposition reactor chamber that is maintained at a temperature in the range of approximately 650–750° C. and pressure of less than approximately 2 torr. For purposes of this disclosure, a conformal dielectric layer refers to a dielectric layer which has a thickness that varies less than approximately 20% across the semiconductor substrate topography 141. Subsequent to the deposition of the conformal dielectric layer, a plasma etch process is used to remove portions of the dielectric layer from planar regions of topography 141. "Planar regions" refer to regions of topography 141 that are substantially parallel to upper surface 101 of semiconductor substrate 102. The plasma etch process described results in the removal of dielectric layer from planar regions of topography 141 while leaving behind the portions of the dielectric layer adjacent to vertical regions of topography 141. In addition to providing a blocking structure for a subsequent implant, spacer structures are useful in silicide processes because they provide a region upon which a subsequently deposited metal will not react thereby preventing short circuits between the source and drain terminals of a transistor with the gate terminals as will be described in greater detail below.

Figure 6:
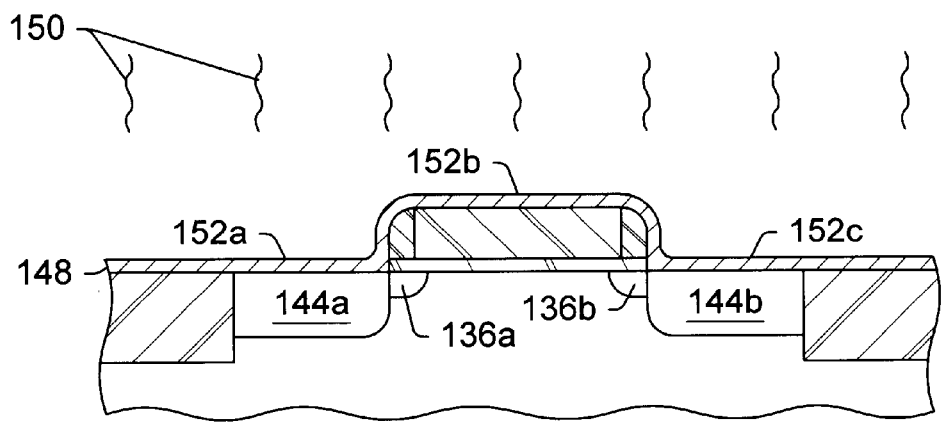
FIG. 6 is a processing step subsequent to FIG. 5 in which a siliciding material has been deposited on the semiconductor substrate topography and heated to form silicide over upper regions of the pair of source/drain regions and the conductive gate structure.

Turning now to FIG. 6, a metal layer 148 is deposited upon semiconductor substrate 102 and immersed in a heated ambient represented in FIG. 6 by reference numeral 150 to a temperature in the range of approximately 400–800° C. until portions 152a, 152b, and 152c of metal layer 148 in contact with underlying silicon react with the underlying silicon to form a silicide. In a preferred embodiment, metal layer 148 comprises titanium. As will be appreciated to those skilled in the art, heating titanium to the indicated temperature in the presence of single crystal silicon or polysilicon results in a reaction between the metal layer and the underlying silicon in which a silicide such as TiSi is formed. Where the metal layer 148 is in contact with a dielectric such as spacer structures 140a and 140b or isolation structures 104a and 104b metal layer 148 will not react. The presence of the reacted portions 152a, 152b, and 152c of metal layer 148 is indicated in FIG. 6 by the cross-hatching in selected regions of metal layer 148. The silicide material provides a low resistivity material to which a subsequently formed interconnect may be connected thereby reducing the contact resistance of the integrated circuit. With the device geometries in the sub-quarter micron region, the contact resistance can become a significantly limiting factor in the maximum operational speed of the device. Therefore, it is highly desirable to minimize contact resistance by providing a conductive layer selectively upon the underlying silicon. As discussed previously, the presence of a nitrogen bearing species within the source/drain regions 122a and 122b retards the interdiffusion of the refractory metal to beneficially minimize the occurrence of junction spiking. The silicide process as described in the present provides the additional advantage of permitting the selective formation of a silicide upon underlying silicon without the use of a masking step. In other words, the reacted silicide is self aligned to the underlying silicon of conductive gate structure 109 and source/drain impurity distributions 144a and 144b. Minimizing the number of masking steps required by a semiconductor process is desirable because of the limited number of photolithography aligning tools within a typical semiconductor fabrication facility.

Figure 7:
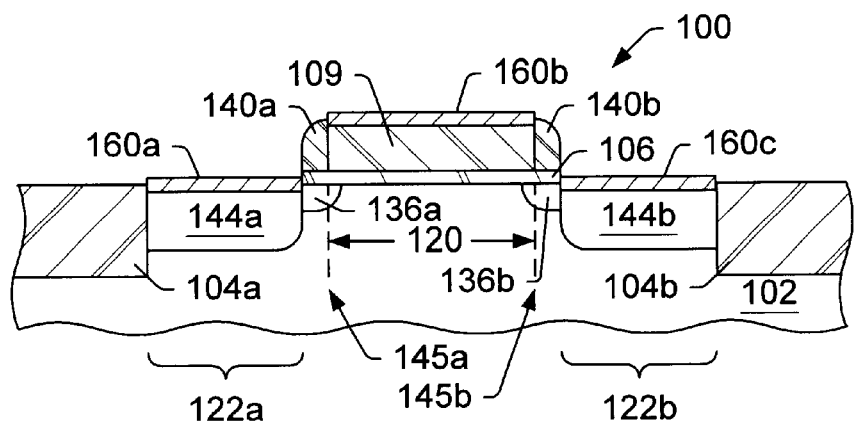
FIG. 7 is a processing step subsequent to FIG. 6 in which portions of the siliciding material that remained unreacted with the semiconductor substrate are removed from the semiconductor substrate upper surface.

Turning now to FIG. 7, the unreacted portions of metal layer 148 (from FIG. 6) have been removed leaving behind silicide structures 160a, 160b, and 160c formed at upper surfaces of source/drain impurity distribution 144a, conductive gate structure 109 and source/drain impurity distribution 144b respectively. Accordingly, FIG. 7 discloses a semiconductor transistor 100 which includes a semiconductor substrate 102, a gate dielectric 106, a conductive gate structure 109, and a pair of source/drain structures 145a and 145b. Semiconductor substrate 102 includes an active region 105 disposed between a pair of isolation structures 104a and 104b. Active region 105 includes a channel region 120 disposed between a pair of source/drain regions 122a and 122b. Gate dielectric 106 is formed on an upper surface 101 of semiconductor substrate 102. Gate dielectric 106 is aligned over channel region 120 of semiconductor substrate 102. Conductive gate structure 109 is formed on an upper surface of gate dielectric 106. Conductive gate structure 109 is aligned over channel region 120 of substrate 102. An upper region of conductive gate structure 109 includes a silicide 160b. In a preferred embodiment, conductive gate structure 109 further includes a nitrogen bearing impurity distribution. Source/drain structures 145a and 145b are located within source/drain regions 122a and 122b of semiconductor substrate 102. Upper regions of source/drain structures 145a and 145b include silicide structures 160a and 160c. In a preferred embodiment, silicide structures 160a, 160b and 160c comprise TiSi. Transistor 100 further includes a pair of spacer structures 140a and 140b located in contact with sidewalls 111a and 111b of conductive gate structure 109. Spacer structures 140a and 140b preferably comprise a dielectric such as silicon-oxide. In the preferred embodiment, spacer structures 140a and 140b mask peripheral regions of source/drain structures 145a and 145b. In the preferred embodiment, source/drain structures 145a and 145b each include a heavily doped impurity distribution 144a and 144b and a lightly doped impurity distribution 136a and 136b. The lightly doped impurity distribution extends laterally to approximately a lateral position of sidewalls 111a and 111b, respectively of conductive gate structure 109. Heavily doped impurity distributions 144a and 144b are laterally displaced away from boundaries of channel region 120 by a displacement approximately equal to a lateral dimension of spacer structures 140a and 140b. In a presently preferred embodiment, source/drain structures 145a and 145b include a nitrogen bearing impurity distribution.

It will be appreciated to those skilled in the art that the present invention contemplates a method of fabricating a semiconductor transistor that facilitates the formation of silicide structures, shallow source/drain structures and improves the resistance of the transistor to penetration by mobile impurities including boron. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A semiconductor fabrication process, comprising:
   forming a conductive gate structure dielectrically spaced over a semiconductor substrate, wherein said semiconductor substrate comprises an active region laterally disposed between a pair of isolation structures, and wherein the conductive gate structure is aligned over a channel region laterally disposed between a pair of source/drain regions within the active region;
   implanting a silicon bearing species into said conductive gate structure and into said source/drain regions to form amorphous silicon-rich regions proximal to respective upper surfaces of said source/drain regions and said conductive gate structure, wherein an implant energy of said implanting a silicon bearing species is in the range of approximately 10 to 15 keV;
   implanting a nitrogen bearing species into said conductive gate; and
   introducing a source/drain impurity distribution into said source/drain regions, wherein said introducing a source/drain impurity distribution comprises implanting a heavily doped impurity distribution into said source/drain regions.

2. The process of claim 1 wherein said semiconductor substrate comprises single crystal silicon.

3. The process of claim 2 wherein said semiconductor substrate comprises a p-type epitaxial layer formed over a p+ silicon bulk, and wherein a resistivity of said p-type epitaxial layer is in the range of approximately 10 to 15 Ω-cm.

4. The process of claim 1, wherein the step of forming said conductive gate structure comprises:

depositing polysilicon on an upper surface of said gate dielectric by thermally decomposing silane in a chemical vapor deposition reactor chamber maintained at a temperature in the range of approximately 580 to 650° C.;
   depositing a photoresist film on said polysilicon;
   photolithographically patterning said photoresist film wherein said patterned photoresist film is aligned over said channel region of said semiconductor substrate; and
   plasma etching exposed portions of said polysilicon.

5. The process of claim 1, wherein said implanting a silicon bearing species comprises implanting the silicon bearing species directly into silicon bearing material for introducing the silicon bearing species into said conductive gate structure and said source/drain regions, and wherein an implant dose of said implanting a silicon bearing species is in the range of approximately $10^{14}$ to $10^{16}$ atoms/cm$^2$.

6. The process of claim 5, wherein said silicon bearing species consists essentially of silicon.

7. The process of claim 1, wherein said implanting a nitrogen bearing species further comprises implanting said nitrogen bearing species directly into said conductive gate and into said source/drain regions, and wherein an implant dose of said implanting a nitrogen bearing species is in the range of approximately $10^{14}$ to $10^{16}$ atoms/cm$^2$.

8. The process of claim 7, wherein said nitrogen bearing species consists essentially of a species selected from the group consisiting of $N_2O$, $NO$ and $N_2$.

9. The process of claim 7, wherein an implant energy of said implanting a nitrogen bearing species is in the range of approximately 10 to 50 keV.

10. The process of claim 1, wherein the step of introducing said source/drain impurity distribution comprises:
    implanting a lightly doped impurity distribution into said semiconductor substrate, wherein the presence of said conductive gate structure during said implanting a lightly doped impurity distribution aligns boundaries of said lightly doped impurity distribution with sidewalls of said conductive gate structure and substantially prevents said lightly doped impurity distribution from entering said channel region of said semiconductor substrate;
    forming spacer structures on said sidewalls of said conductive gate structure, wherein said spacer structures mask portions of said source/drain regions proximal to said channel region; and
    wherein the presence of said conductive gate structure and said spacer structures during said implanting a heavily doped impurity distribution aligns said heavily doped impurity distribution with sidewalls of said spacer structures whereby boundaries of said heavily doped impurity distribution are laterally displaced from respective boundaries of said channel region.

11. The process of claim 10, wherein a dose for said implanting of said lightly doped impurity distribution is less than approximately $2\times10^{15}$ atoms/cm$^2$ and firther wherein an energy of said implanting is in the range of approximately 10 to 50 keV.

12. The process of claim 10, wherein a dose for said implanting of said heavily doped impurity distribution is in greater than approximately $2\times10^{15}$ atoms/cm$^2$ and further wherein an energy of said implanting is in the range of approximately 20 to 100 keV.

13. The process of claim 10, wherein the step of forming said spacer structures comprises:

depositing a conformal dielectric layer on a topography comprising said semiconductor substrate and said conductive gate structure;

plasma etching said conformal dielectric layer until portions of said conformal layer above planar regions of said topography are removed, wherein said planar regions are substantially parallel with said upper surface of said semiconductor substrate.

14. The process of claim 13, wherein the step of depositing said conformal dielectric layer comprises decomposing TEOS in a chemical vapor deposition reactor chamber maintained at a temperature in the range of approximately 650 to 750° C. and a pressure of less than approximately 2 torr.

15. The process of claim 1, further comprising:

removing said dielectric layer from portions of said semiconductor substrate upper surface disposed above said source/drain regions;

depositing a siliciding metal on a topography comprising said semiconductor substrate, said conductive gate structure and said spacer structures;

heating said semiconductor substrate until said siliciding metal reacts with silicon rich regions of said source/drain regions and said conductive gate structure.

16. A semiconductor fabrication process, comprising:

forming a conductive gate dielectrically spaced over a channel region of a semiconductor substrate, wherein the channel region is laterally interposed between a pair of source/drain regions; and implanting a silicon bearing species directly into silicon bearing material for introducing the silicon bearing species into said conductive gate structure and into said source/drain regions to form amorphous silicon-rich regions proximal to respective upper surfaces of said source/drain regions and said conductive gate structure, wherein an implant energy of said implanting a silicon bearing species is in the range of approximately 10 to 15 keV.

17. The semiconductor fabrication process of claim 16, further comprising implanting a nitrogen bearing species directly into said conductive gate and into said source drain regions.

18. A semiconductor fabrication process, comprising:

forming a conductive gate structure dielectrically spaced over a semiconductor substrate, wherein said semiconductor substrate comprises an active region laterally disposed between a pair of isolation structures, and wherein the conductive gate structure is aligned over a channel region laterally disposed between a pair of source/drain regions within the active region;

implanting a silicon bearing species into said conductive gate structure and into said source/drain regions to form amorphous silicon-rich regions proximal to respective upper surfaces of said source/drain regions and said conductive gate structure;

implanting a nitrogen bearing species into said conductive gate; and introducing a source/drain impurity distribution into said source/drain regions, wherein said introducing a source/drain impurity distribution comprises implanting a heavily doped impurity distribution into said source/drain regions, and wherein after said implanting a silicon bearing species and said implanting a heavily doped impurity distribution, a peak concentration of silicon bearing species within said source/drain regions is closer to said respective upper surfaces of said source/drain regions than a peak concentration of the heavily doped impurity distribution within said source/drain regions.

19. The semiconductor fabrication process of claim 18, wherein said implanting a silicon bearing species comprises implanting the silicon bearing species directly into said conductive gate structure for introducing the silicon bearing species into said conductive gate stucture.

20. The semiconductor fabrication process of claim 18, wherein an implant energy of said implanting a silicon bearing species is in the range of approximately 10 to 15 keV.

21. The semiconductor fabrication process of claim 18, wherein said introducing the source/drain impurity distribution comprises:

implanting a lightly doped impurity distribution into said semiconductor substrate, wherein the presence of said conductive gate structure during said implanting a lightly doped impurity distribution aligns boundaries of said lightly doped impurity distribution with sidewalls of said conductive gate structure and substantially prevents said lightly doped impurity distribution from entering said channel region of said semiconductor substrate;

forming spacer structures on said sidewalls of said conductive gate structure, wherein said spacer structures mask portions of said source/drain regions proximal to said channel region; and implanting a heavily doped impurity distribution into said semiconductor substrate, wherein the presence of said conductive gate structure and said spacer structures during said implanting a heavily doped impurity distribution aligns said heavily doped impurity distribution with sidewalls of said spacer structures whereby boundaries of said heavily doped impurity distribution are laterally displaced from respective boundaries of said channel region.

22. The semiconductor fabrication process of claim 21, wherein said forming spacer structures comprises:

depositing a conformal dielectric layer on a topography comprising said semiconductor substrate and said conductive gate structure; and plasma etching said conformal dielectric layer until portions of said conformal layer above planar regions of said topography are removed, wherein said planar regions are substantially parallel with said upper surface of said semiconductor substrate.

* * * * *

UNITED STATES PATENT AND TRADEMARK OFFICE
CERTIFICATE OF CORRECTION

PATENT NO.   : 6,306,763 B1                                   Page 1 of 1
DATED        : October 23, 2001
INVENTOR(S)  : Gardner et al.

It is certified that error appears in the above-identified patent and that said Letters Patent is hereby corrected as shown below:

Column 12, claim 11,
Line 58, please delete the word "firther" and substitute therefor -- further --.

Signed and Sealed this

Twelfth Day of March, 2002

Attest:

JAMES E. ROGAN
*Attesting Officer*     *Director of the United States Patent and Trademark Office*